United States Patent
Kikuch et al.

(10) Patent No.: US 7,999,333 B2
(45) Date of Patent: Aug. 16, 2011

(54) SEMICONDUCTOR DEVICE

(75) Inventors: Shuichi Kikuch, Gunma (JP); Shigeaki Okawa, Tochigi (JP); Kiyofumi Nakaya, Saitama (JP); Toshiyuki Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 920 days.

(21) Appl. No.: 11/391,166

(22) Filed: Mar. 27, 2006

(65) Prior Publication Data
US 2006/0220099 A1     Oct. 5, 2006

(30) Foreign Application Priority Data

Mar. 30, 2005    (JP) .................................. 2005-098966
Jun. 30, 2005    (JP) .................................. 2005-191023

(51) Int. Cl.
*H01L 29/76*    (2006.01)
(52) U.S. Cl. ........ 257/409; 257/494; 257/495; 257/544; 257/343
(58) Field of Classification Search .......... 257/335–343, 257/409, 492–496, 544–550
See application file for complete search history.

(56) References Cited

U.S. PATENT DOCUMENTS

| | | | | |
|---|---|---|---|---|
| 6,989,566 B2 * | 1/2006 | Noda et al. | ..................... | 257/339 |
| 7,098,509 B2 * | 8/2006 | Zdebel et al. | .................. | 257/355 |
| 7,294,901 B2 * | 11/2007 | Shimizu | ........................ | 257/492 |
| 7,327,007 B2 * | 2/2008 | Shimizu | ........................ | 257/487 |

FOREIGN PATENT DOCUMENTS

| | | |
|---|---|---|
| CN | 1389918 A | 1/2003 |
| JP | 09-260503 | 10/1997 |
| JP | 10-242452 | 9/1998 |

* cited by examiner

*Primary Examiner* — Ori Nadav
(74) *Attorney, Agent, or Firm* — Fish & Richardson P.C.

(57) ABSTRACT

In a conventional semiconductor device, there has been a problem that, in a region where a wiring layer to which a high electric potential is applied traverses a top surface of an isolation region, the withstand voltage is deteriorated. In a semiconductor device of the present invention, an epitaxial layer is deposited on a substrate, and an LDMOSFET is formed in one region divided by an isolation region. In a region where a wiring layer connected to a drain electrode traverses a top surface of the isolation region, a conductive plate having a ground electric potential and another conductive plate in a floating state are formed under the wiring layer. With this structure, electric field is reduced in the vicinity of the isolation region under the wiring layer, whereby a withstand voltage of the LDMOSFET is increased.

6 Claims, 6 Drawing Sheets

SEMICONDUCTOR DEVICE

Priority is claimed to Japanese Patent Application Numbers JP2005-098966, filed on Mar. 30, 2005, and JP2005-191023, filed on Jun. 30, 2005, the disclosures of which are incorporated herein by reference in its entireties.

BACKGROUND OF THE INVENTION

1. Field of the Invention

The present invention relates to a semiconductor device configured to reduce an electric field concentration in the vicinity of its isolation region and thereby to increase its withstand voltage characteristic.

2. Background Art

As one of conventional power semiconductor devices, a lateral double diffused metal oxide semiconductor field effect transistor (hereinafter, referred to as an LDMOSFET) has been known. The LDMOSFET is, for example, integrated on the same semiconductor chip as other signal processing circuits are integrated, and used as a driver circuit. There, in one region over a top surface of an isolation region thereof, a drain electrode for applying a high electric potential to a drain region of the LDMOSFET is drawn to the outside in a manner straddling the isolation region. In the isolation region located under the drain electrode, a diffusion region less doped than the isolation region is extended from the isolation region toward the drain region. There has been known a technology which, with this structure, reduces the electric field concentration in the vicinity of an edge of the isolation region straddled by the drain electrode to increase a withstand voltage between a drain and a source. This technology is described for instance in Japanese Patent Application publication No. Hei10(1998)-242452 (pp. 6 to 8 and FIGS. 1 to 3).

The conventional LDMOSFET for high voltage use is integrated on the same chip as other signal processing circuits (for example, a control circuit and a logical circuit) are integrated, and forms a high voltage integrated circuit. A structure thereof is such that, in an epitaxial layer laminated on a semiconductor substrate, there is formed an isolation region stretching from a surface of the epitaxial layer and reaching the substrate. A region where the LDMOSFET is formed is electrically insulated and isolated from other element formation regions by an isolation region. In one region above a top surface of the isolation region, a drain electrode for applying a high electric potential to a drain region of the LDMOSFET is drawn to the outside in a manner straddling the isolation region. In the isolation region located under the drain electrode, a conductive layer which is electrically connected to the isolation region is formed so that the conductive layer covers a top surface of a junction region between the epitaxial layer and the isolation region. There has been known a technology which, by having this structure, reduces the electric field concentration in the vicinity of an edge of the isolation region straddled by the drain electrode to increase the withstand voltage between a drain and a source. This technology is described for instance in Japanese Patent Application publication No. Hei9(1997)-260503 (pp. 4 to 6 and FIGS. 1 to 5).

As described above, in the conventional LDMOSFET, in order to reduce the electric field concentration in the vicinity of an edge of an isolation region straddled by a drain electrode, the diffusion region less doped than the isolation region is extended from the isolation region toward the drain region. Furthermore, the drain region is formed in a region away from the isolation region by forming the diffusion region, which has the electric potential equal to that of the isolation region, in a manner extending toward the drain region. With this structure, under the above diffusion region, an invalid region where the LDMOSFET is not arranged is formed. Therefore, there is the problem that element formation regions are not efficiently arranged with respect to a chip size.

Additionally, in the conventional LDMOSFET, in order to reduce the electric field concentration in the vicinity of the edge of the isolation region located under the drain electrode, the conductive layer extending from a top surface of the isolation region toward the drain region is formed. There, the conductive layer has the electric potential equal to that of the isolation region. With this structure, the conductive layer is allowed to have a shielding effect against the drain electrode. On the other hand, the conductive layer has a field plate effect which influences an electric potential distribution formed in an epitaxial layer. Specifically, in the drain region, it is required to reduce an influence from the conductive layer by providing a larger separation distance between the conductive layer and the epitaxial layer. This structure involves a necessity of thickening an insulating film on a top surface of the epitaxial layer, and there is a problem that a higher manufacturing cost is required.

Additionally, in the conventional LDMOSFET, in order to reduce the electric field concentration in the vicinity of the edge of the isolation region located under the drain electrode, the conductive layer extending from the top surface of the isolation region toward the drain region is formed. The conductive layer is formed stepwise so that a separation distance from the epitaxial layer comes to be larger in a region closer to the drain region. There, the conductive layer is formed of metal such as aluminum or a low-resistant material such as polysilicon. With this structure, fine patterning in a small region between the conductive layer and the drain region is required, and there is a problem that complication of manufacturing processes is brought about. Furthermore, since film thicknesses of an insulating film under the conductive layer are varied, a dedicated process for forming the conductive layer is required. Thereby, there is a problem that a higher manufacturing cost is required.

SUMMARY OF THE INVENTION

The present invention was made in consideration of the circumstances described above. A semiconductor device of the present invention includes an isolation region which divides a semiconductor layer into a plurality of element formation regions; an insulating layer formed on the semiconductor layer; and a wiring layer traversing over the isolation region, and wired from one to other one of the element formation regions on a top surface of the insulating layer. The semiconductor device also includes a first conductive plate in the insulating layer under the wiring layer, which is arranged in a manner covering over a junction region between the isolation region and the semiconductor layer, and is electrically connected to the isolation region; and a second conductive plate arranged, in a floating state, between the first conductive plate and the wiring layer, and formed in a manner having at least a part of a region thereof traversing each of the first conductive plate and the wiring layer. Accordingly, in the present invention, the electric potential equal to that of the isolation region is applied to the first conductive plate. The second conductive plate results in having an electric potential at a middle level between the electric potentials of the wiring layer and the first conductive plate, by a capacitance division ratio thereof. With this structure, it comes to be possible to reduce an electric field concentration in the vicinity of the isolation region and hence to increase a withstand voltage characteristic.

Additionally, in the semiconductor device of the present invention, the second conductive plate is extended under the wiring layer in a direction away from the isolation region, and that one edge of the second conductive plate is more distant from the isolation region than one edge of the first conductive plate is. Accordingly, in the present invention, the second conductive plate has a shielding effect against the wiring layer. On the other hand, the second conductive plate has a field plate effect which influences an electric potential distribution formed in the semiconductor layer.

Additionally, in the semiconductor device of the present invention, the second conductive plate results in having an electric potential which is 0.3 to 0.6 times of an electric potential applied to the wiring layer. Accordingly, in the present invention, the second conductive plate comes to be in capacitive coupling with each of the first conductive plate and the wiring layer. With this structure, the second conductive plate comes to have an electric potential which is 0.3 to 0.6 times of an electric potential applied to the wiring layer, by a capacitance division ratio thereof. Thereby, it is possible to reduce the electric field concentration in an edge of the first conductive plate.

Furthermore, in the semiconductor device of the present invention, the first conductive plate is formed of a polysilicon film. Accordingly, in the present invention, the first conductive plate is formed of the polysilicon film. With this structure, when an MOSFET is formed in one of the element formation regions, the first conductive plate is formed in a common process to that of a gate electrode.

Moreover, in the semiconductor device of the present invention, the first and second conductive plates are formed under the wiring layer to which an electric potential higher than that applied to the isolation layer is applied. Accordingly, in the present invention, the first and second conductive plates are arranged under the wiring layer to which an electric potential higher than an electric potential applied to the isolation layer is applied. With this structure, the electric field concentration under the wiring layer to which a high electric potential is applied is reduced, whereby the withstand voltage characteristic can be increased.

Another semiconductor device of the present invention includes an isolation region which divides a semiconductor layer into a plurality of element formation regions; an insulating layer formed on the semiconductor layer; and a wiring layer which traverses over the isolation region, and is wired from one to other one of the element formation regions on a top surface of the insulating film. The semiconductor device also includes a first conductive plate in the insulating layer under the wiring layer, which is arranged, in a floating state, in a manner covering over a junction region between the isolation region and the semiconductor layer; and a second conductive plate arranged, in the floating state, between the first conductive plate and the wiring layer, and formed in a manner having at least a part of a region thereof traversing each of the first conductive plate and the wiring layer. Accordingly, in the present invention, it is possible to set different electric potentials as the electric potentials of the first and second conductive plates, by the capacitance division ratio thereof. With this structure, it comes to be possible to reduce the electric field concentration in the vicinity of the isolation region located under the wiring layer to which a high electric potential is applied, and hence to increase the withstand voltage characteristic.

Additionally, in the semiconductor device of the present invention, the first conductive plate has an electric potential higher than that of the isolation region, and lower than that of the second conductive plate. Accordingly, in the present invention, the first conductive plate has a shielding effect against the second conductive layer. On the other hand, the first conductive plate has the field plate effect which influences the electric potential distribution formed in the semiconductor layer.

Still another semiconductor device of the present invention includes an isolation region formed in a semiconductor layer; a plurality of semiconductor elements formed in a manner surrounded by the isolation region; a wiring layer formed in an insulating process, and extending from one to other one of the semiconductor elements with passing the isolation region through, the wiring layer being fixed at a desired electric potential; a first conductive plate arranged under the wiring layer in a manner overlapping the wiring layer, and electrically connected to the isolation region, the first conductive plate having been formed in an insulating process; and a second conductive plate arranged between the first conductive plate and the wiring layer in a manner overlapping the first conductive plate and the wiring layer, the second conductive plate having been formed in an insulating process. Also, in the semiconductor device, an electric potential of the second conductive plate is adjusted by changing a dimension where the second conductive plate and the wiring layer overlap, and a dimension where the second and first conductive plates overlap. Accordingly, in the present invention, the first and second conductive plates formed in an insulating process are arranged in insulating layers under the wiring layer electrically connecting semiconductor elements to each other. With this structure, it is possible to adjust the electric potential of the second conductive plate and hence to increase the withstand voltage characteristic of the semiconductor device, by adjusting the dimension where the second and first conductive plates overlap, and the dimension where the second conductive plate and the wiring layer overlap.

BRIEF DESCRIPTION OF THE DRWAINGS

DESCRIPTION OF THE PREFERRED EMBODIMENTS

Figure 1:
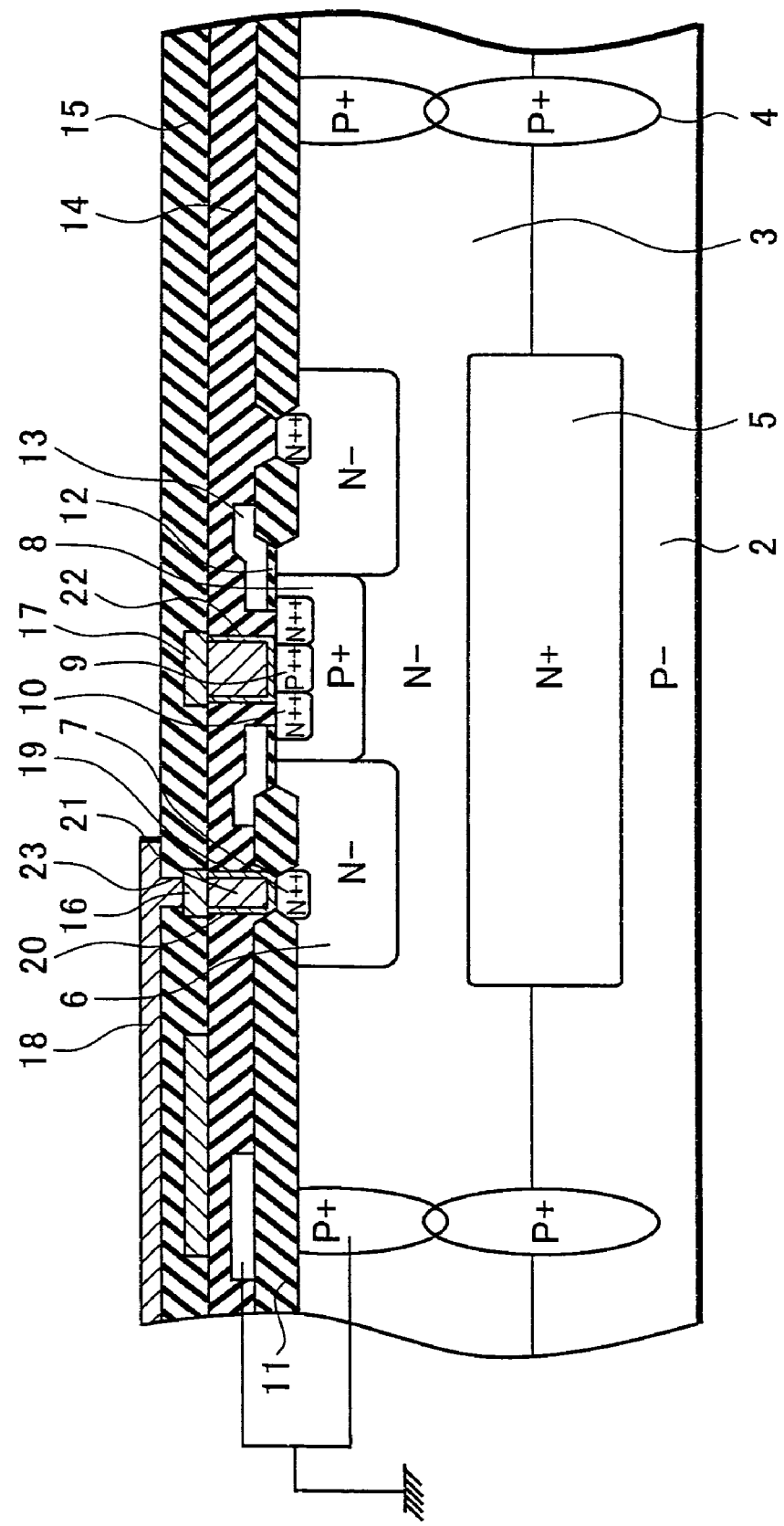
FIG. 1 is a cross-sectional view for explaining an N-channel LDMOSFET in an embodiment of the present invention.
Figure 2A:
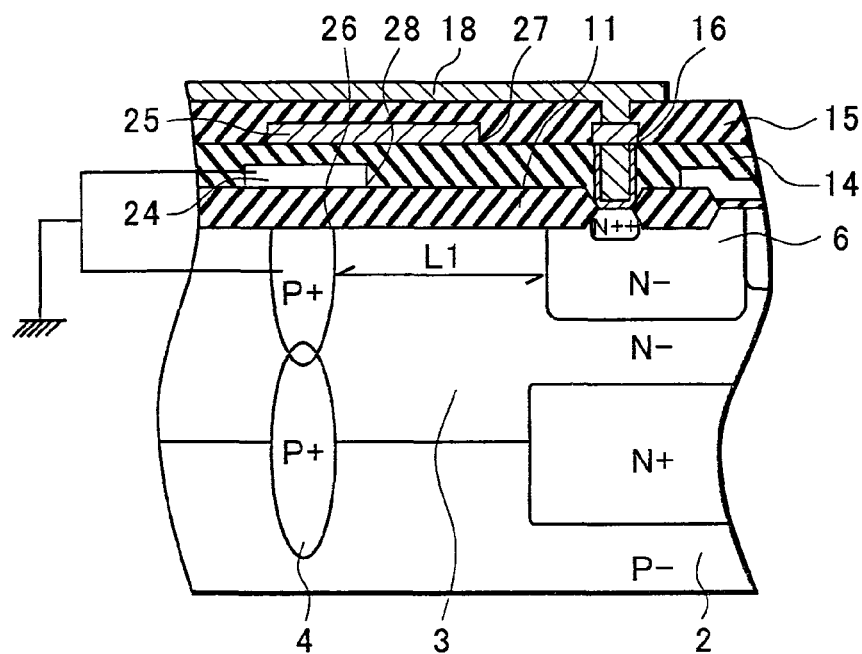
FIG. 2A is a cross-sectional view for explaining electric field reduction structure at a top surface of an isolation region in the embodiment of the present invention.
Figure 2B:
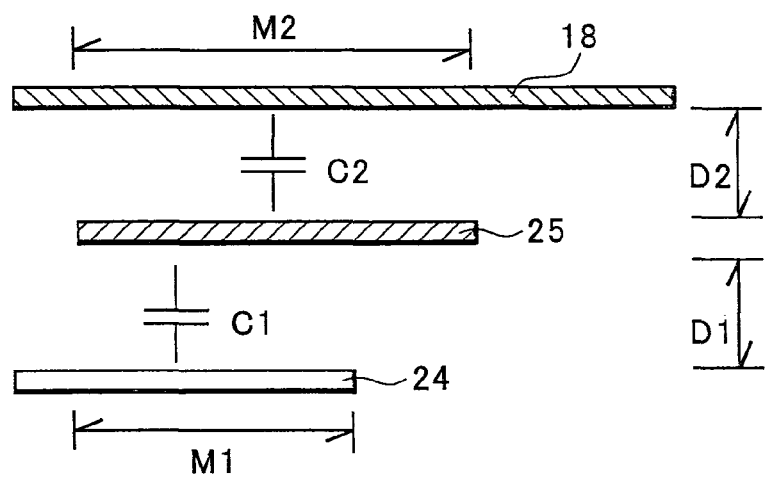
FIGS. 2B and 2C are illustrations for explaining a state of capacitive coupling at the top surface of the isolation region in the embodiment of the present invention.
Figure 2C:
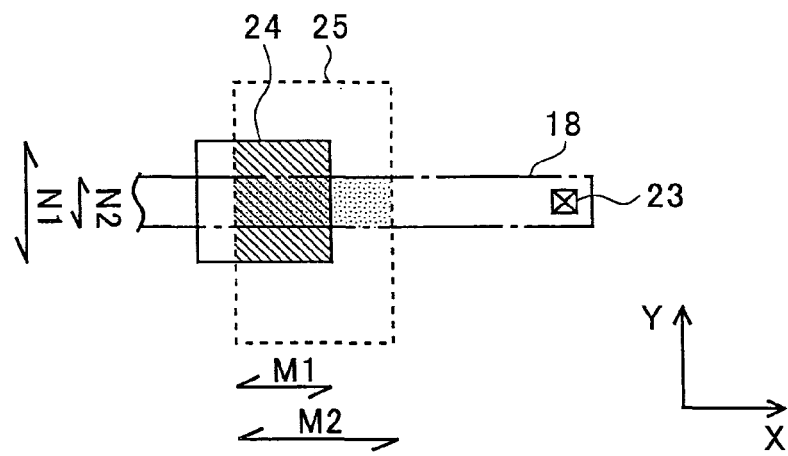
Figure 3:
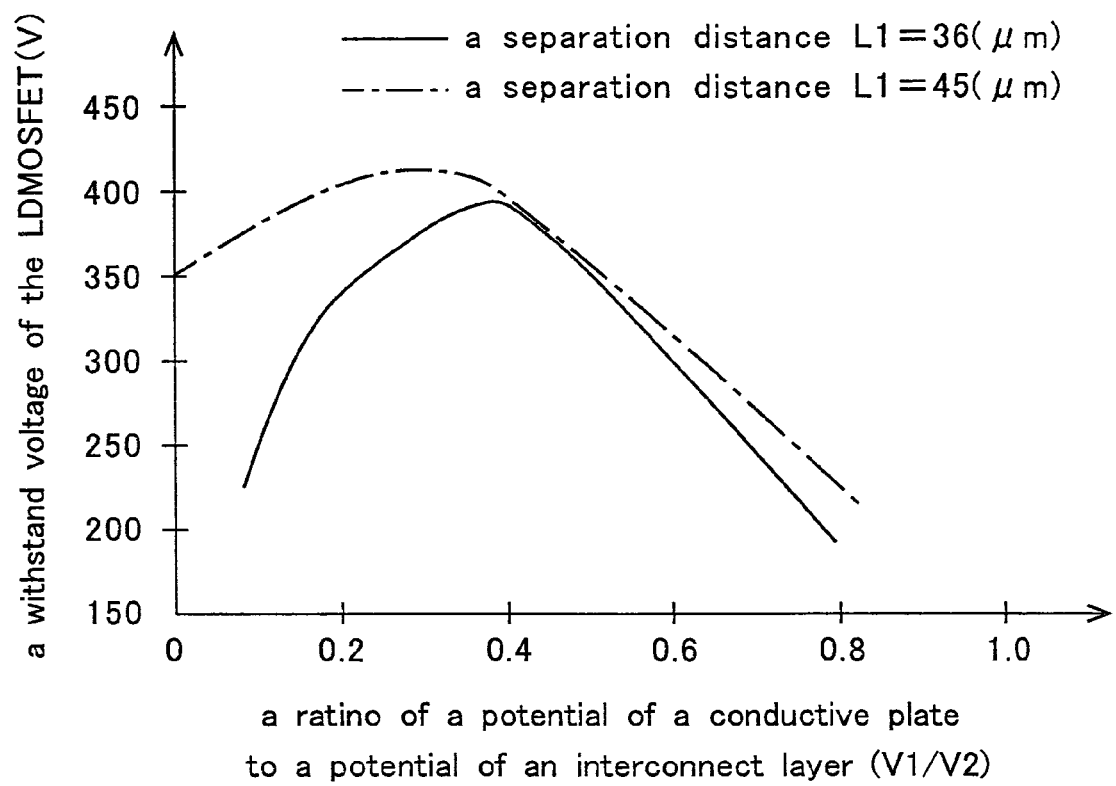
FIG. 3 is a chart for explaining a relation between a ratio of an electric potential of a wiring layer to an electric potential of a conductive plate and a withstand voltage of the LDMOSFET in the embodiment of the present invention.
Figure 4A:
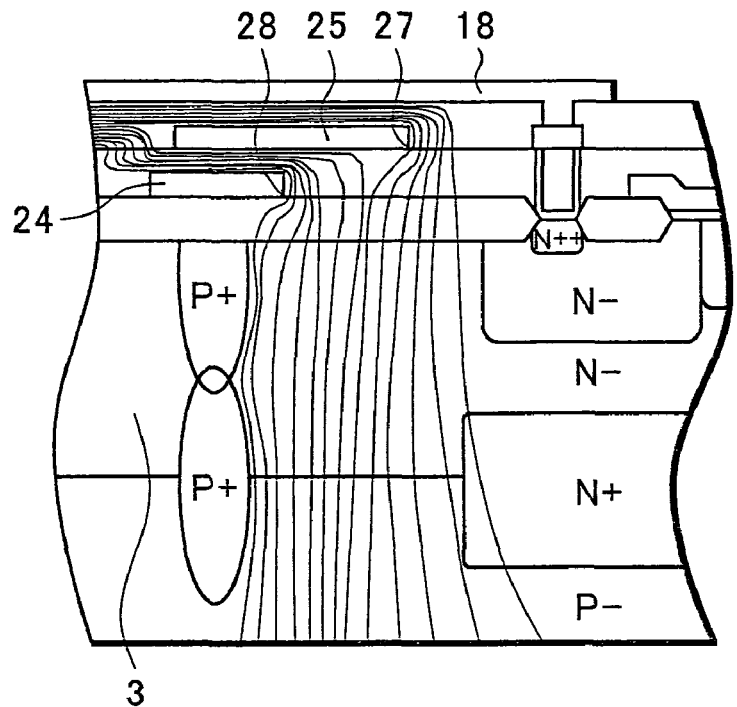
FIGS. 4A and 4B are illustrations for explaining an electric potential distribution, and for explaining an impact ionization generation region, respectively, in the LDMOSFET in the embodiment of the present invention.
Figure 4B:
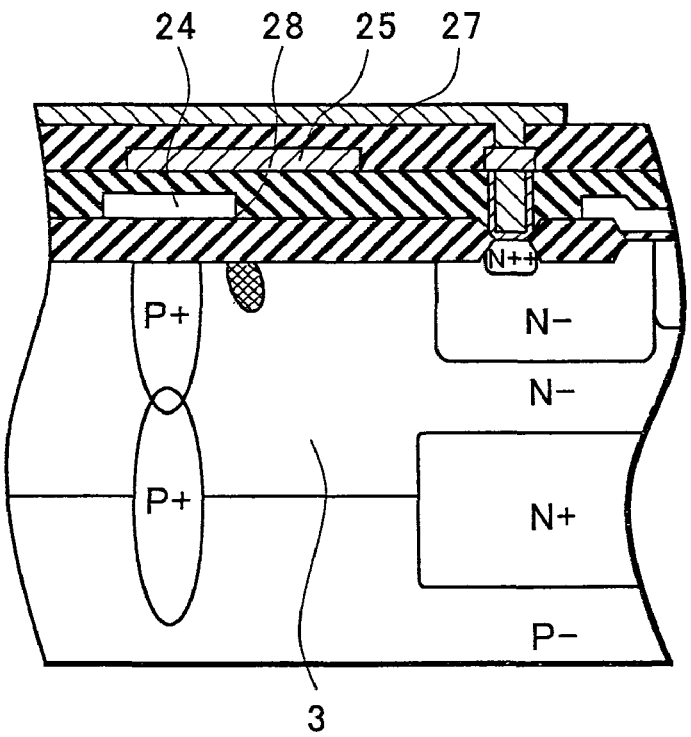

Hereinafter, a semiconductor device of one embodiment of the present invention will be described in detail with reference to FIGS. 1 to 4B. FIG. 1 is a cross-sectional view for explaining an N-channel LDMOSFET in this embodiment. FIG. 2A is a cross-sectional view for explaining an electric field reduction structure over a top surface of an isolation region in this embodiment. FIG. 2B is as illustration for explaining a state of capacitive coupling over the top surface of the isolation region in this embodiment. FIG. 2C is an illustration for explaining a state of capacitive coupling over the top surface of the isolation region in this embodiment. FIG. 3 is a chart for explaining a relation between a withstand voltage of the LDMOSFET and a ratio of an electric potential of a conductive plate to that of a wiring layer in this embodiment. FIG. 4A is an illustration for explaining an electric potential distribution in the LDMOSFET in this embodiment. FIG. 4B is an illustration for explaining an impact ionization generation region in the LDMOSFET in this embodiment.

As shown in FIG. 1, the N-channel LDMOSFET 1 mainly comprises: a P-type single-crystal silicon substrate 2, an N-type epitaxial layer 3, a P-type isolation region 4, an N-type buried diffusion layer 5, N-type diffusion layers 6 and 7 used as a drain region, P-type diffusion layers 8 and 9 used as a back gate region, an N-type diffusion layer 10 used as a source region, a LOCOS oxide film 11, a gate oxide film 12, a gate electrode 13, insulating layers 14 and 15, a drain electrode 16, a source electrode 17, and a wiring layer 18.

The N-type epitaxial layer 3 is deposited on a top surface of the P-type single-crystal silicon substrate 2. Note that the epitaxial layer 3 in this embodiment corresponds to "a semiconductor layer" of the present invention. Meanwhile, although the case where the single epitaxial layer 3 is formed on the substrate 2 is shown in this embodiment, the present invention is not limited to this case. For example, as "the semiconductor layer" of the embodiment of the present invention, a plurality of epitaxial layers may be laminated on the top surface of the substrate. Additionally, only a substrate may be provided as "the semiconductor layer" of the present invention, and in that case, either of an N-type single-silicon substrate or a compound semiconductor substrate is applicable.

The P-type isolation region 4 is formed in the substrate 2 and the epitaxial layer 3. The P-type isolation region 4 is formed as a result of connection of a P-type buried diffusion layer diffused from a surface of the substrate 2, and P-type diffusion layer diffused from a surface of the epitaxial layer 3. Here, the isolation region 4 results in having the same electric potential as the substrate 2, and to the isolation region 4, for example, a ground electric potential (GND) is applied. With this structure, the epitaxial layer 3 is divided into a plurality of element formation regions by a PN junction region between the isolation region 4 and the epitaxial layer 3, and a PN junction region between the substrate 2 and the epitaxial layer 3.

The N-type buried diffusion layer 5 is formed in a region included both in the substrate 2 and in the epitaxial layer 3. The N-type buried diffusion layer 5 is formed by diffusing, for example, antimony (Sb). As illustrated, the N-type buried diffusion layer 5 is formed in a lower part of a formation region of the LDMOSFET 1.

The N-type diffusion layers 6 and 7 are formed in the epitaxial layer 3. The N-type diffusion layer 6 is used as a drain region and the N-type diffusion layer 7 is used as a drain extraction region. The N-type diffusion layers 6 and 7 are formed in a shape of a ring in a manner surrounding the P-type diffusion layer 8.

The P-type diffusion layers 8 and 9 are formed in the epitaxial layer 3. The P-type diffusion layer 8 is used as a back gate region and the P-type diffusion layer 9 is used as a back gate extraction region.

The N-type diffusion layer 10 is formed in the P-type diffusion layer 8. The N-type diffusion layer 10 is used as a source region. The N-type diffusion layer 10 is formed in the shape of a ring in a manner surrounding the P-type diffusion layer 9. The P-type diffusion layer 8 located between the N-type diffusion layer 10 and the N-type diffusion layer 6 is used as a channel region.

The LOCOS (Local Oxidation of Silicon) oxide film 11 is formed on a desired region on the epitaxial layer 3. The LOCOS oxide film 11 is formed on a top surface of the isolation region 4, whereby device isolation is accomplished. Note that it is sufficient that the LOCOS oxide film 11 is a thick oxidation film. For example, a case is applicable where the isolation region 4 has a structure in which a trench is formed on the top surface of the isolation region 4, and then the trench is buried with an insulating film, with a shallow trench isolation (STI) method.

The gate oxide film 12 is formed on a surface of the epitaxial layer 3 where the back gate region and the like are formed. The gate oxide film 12 is formed of, for example, a silicon oxide film, and has a film thick enough to resist an electric field from the gate electrode 13.

The gate electrode 13 is formed on the gate oxide film 12. The gate electrode 13 is formed of, for example, a polysilicon film, a tungsten silicon film or the like, so as to be a desired film thickness. Note that, as a material constituting the gate electrode 13, one obtained by laminating a tungsten silicon film on a polysilicon film is applicable.

The insulating layers 14 and 15 are formed on the top surface of the epitaxial layer 3. The insulating layers 14 and 15 are formed by selectively laminating, for example, a silicon oxide film, a silicon nitride film, a tetra-ethyl-orso-silicate (TEOS) film, a boron phospho silicate glass (BPSG) film, a spin on glass (SOG) film and the like. There, the insulating layer 14 is formed between a firstly deposited metal layer and the epitaxial layer 3, and the insulating layer 15 is formed between the firstly deposited metal layer and a secondly deposited metal layer, respectively.

The drain electrode 16 is connected to the N-type diffusion layer 7 through a contact hole 19 formed in the insulating layer 14. The drain electrode 16 has a structure in which, for example, an aluminum silicon (AlSi) layer, and an aluminum copper (AlCu) layer or an aluminum silicon copper (AlSiCu) layer, are laminated on a barrier metal layer. Meanwhile, in the contact hole 19, for example, a barrier metal film 20 and a tungsten (W) film 21 are buried.

The source electrode 17 is connected to the P-type diffusion layer 9 and to the N-type diffusion layer 10 through a contact hole 22 formed in the insulating layer 14. The source electrode 17 has a structure in which, for example, an aluminum silicon (AlSi) layer, and an aluminum copper (AlCu) layer or an aluminum silicon copper (AlSiCu) layer are laminated on a barrier metal layer. With this structure, a back gate electric potential, which is equal to a source electric potential, is applied to the P-type diffusion layer 8. Note that, as in the case with the contact hole 19, for example, a barrier metal film and a tungsten film are buried in the contact hole 22.

The wiring layer 18 is formed on a top surface of the insulating film 15. The wiring layer 18 is connected to the drain electrode 16 through a contact hole 23 formed in the insulating layer 15. There, the wiring layer 18 traverses over the isolation region 4 to be drawn to other element formation regions. Here, in the LDMOSFET, a power source electric potential (Vcc) is applied to the drain electrode 16 and a ground electric potential (GND) is applied to the source electrode 17, for example. Then, ON and OFF operations of the LDMOSFET are made by an electric potential applied to the gate electrode 13, in a state where an element formation region is depleted. That is, a high electric potential is applied to the wiring layer 18 which is connected to the drain electrode 16. Note that, although only the wiring layer 18 connected to the drain electrode 16 is illustrated in the cross section shown in FIG. 1, there are also other wiring layers which are connected to the gate electrode 13 and to the source electrode, respectively.

Finally, although it is not illustrated, a BPSG film, a SOG film, a TEOS film, a silicon nitride film, and the like are formed by being selectively laminated them on a top surface of the insulating layer 15. Meanwhile, the silicon nitride film formed in the uppermost layer is used as a shielding film, whereby it is possible to prevent the intrusion of moisture.

As shown in FIG. 2A, conductive plates 24 and 25 are formed below the wiring layer 18, in a region where the wiring layer 18 connected to the drain electrode 16 traverses over the isolation region 4. Note that the conductive plate 24 in this embodiment corresponds to "a first conductive plate" of the present invention, and the conductive plate 25 corresponds to "a second conductive plate" of the present invention.

The conductive plate 24 is electrically connected to the isolation region 4 through a contact hall (not illustrated). The conductive plate 24 comes to have an electric potential which is equal to that of the isolation region 4, and for example, the conductive plate 24 comes to be in a state where the ground electric potential (GND) is applied. Additionally, the conductive plate 24 is formed in the same process as a formation process of the gate electrode 13, and is formed of the same material as the gate electrode 13. Moreover, the conductive plate 24 is formed to be extended toward element formation region in a manner covering over a PN junction region between the isolation region 4 and the epitaxial layer 3. With this structure, a shielding effect of the conductive plate 24 can be obtained, an electric field concentration in the vicinity of edge 26 of the isolation region 4 can be reduced, and the withstand voltage between the drain and source can be increased. As a result, it is not necessary to form in the epitaxial layer 3 a P-type diffusion layer extending from the edge 26 of the isolation region 4. That is, a separation distance L1 from the edge 26 and the N-type diffusion layer 6 does not become large, and hence, an invalid region in each of the element formation regions does not increase. Also, it is possible to arrange element formation regions efficiently with respect to a chip size.

The conductive plate 25 is formed in the formation process of the firstly deposited metal plate for forming the drain electrode 16 and the like, and is formed of the same material as the drain electrode 16. The conductive plate 25 is formed between the insulating films 14 and 15, and is in a floating state. However, the conductive plate 25 is in capacitive coupling with the wiring layer 18 and to the conductive plate 24, respectively. There, the conductive plate 25 results in having a middle electric potential of the electric potential of the wiring layer 18 and the conductive plate 24, in accordance with a capacitance division ratio thereof. Moreover, one edge 27 of the conductive plate 25 is more distant from the isolation region 4 than one edge 26 of the conductive plate 24 is. With this structure, the conductive plate 25 has a field plate effect, and then the electric field concentration in the vicinity of one edge 28 of the conductive plate 24 can be reduced, whereby the withstand voltage between the drain and source can be increased.

As shown in FIG. 2B, by using the insulting layer 14 as a dielectric material, the conductive plate 25 in the floating state comes to be in capacitive coupling with the conductive plate 24 having a ground electric potential (GND). Here, a capacitance of the conductive plates 24 and 25 is denoted by C1. On the other hand, by using the insulting layer 15 as a dielectric material, the conductive plate 25 comes to be in capacitive coupling with the wiring layer 18 having a drain electric potential. Here, a capacitance of the conductive plate 25 and the wiring layer 18 is denoted by C2. Note that M1 denotes a width in which the conductive plates 24 and 25 face each other in an X-axis direction, and that M2 denotes a width in which the conductive plates 25 and the wiring layer 18 face each other in the X-axis direction.

As shown in FIG. 2C, any design changes of the capacitances C1 and C2 are possible in dependence on a pattern arrangement of the conductive plate 25. A solid line denotes the conductive plate 24, a dotted line denotes the conductive plate 25, and adashed-dotted line denotes the wiring layer 18. An area where the conductive plates 24 and 25 face each other is indicated by a hatching with oblique lines, and an area where the conductive plate 25 and the wiring layer 18 face each other is indicated a hatching with dots. For example, in a case where the conductive plate 25 is designed to be narrower than the conductive plate 24 and wider than the wiring layer 18 in a Y-axis direction, N1 comes to be smaller, and hence the area where the conductive plates 24 and 25 face each other comes to smaller. As a result, the capacitance C1 is reduced. Meanwhile, in a case where the conductive plate 25 is extended more toward the contact hole 23 than the conductive plate 24, M2 comes to be larger, and hence the area where the conductive plates 25 and the wiring layer 18 face each other becomes larger. As a result, the capacitance C2 is increased. Note that N1 denotes a width in which the conductive plate 24 and the conductive plate 25 face each other in the Y-axis direction, and that N2 denotes a width in which the conductive plate 25 and the wiring layer 18 face each other in the Y-axis direction.

Additionally, the capacitance C1 and C2 which are respectively the capacitance of the conductive plate 25 and each of the wiring layer 18 and the conductive plate 24, are changed with the above conditions. That is, in a case where the conductive plate 24 and the wiring layer 18 are arranged to be fixed in certain regions, it can be considered that a quantity of electric charge between the conductive plate 24 and the wiring layer 18 is constant. In this case, the capacitances C1 and C2 are changed in dependence on the region where the conductive plate 25 is arranged, whereby an electric potential of the conductive plate 25 can be adjusted by a capacitance division ratio thereof. In this embodiment, in dependence on design conditions such as dimensions and an arrangement location of the conductive plate 25, an electric potential of the conductive plate 25 can be adjusted. Note that, in a case where a design of a pattern arrangement of the conductive plate 24 and the wiring layer 18 is changed, similarly, it is also possible to adjust an electric potential of the conductive plate 25 by adjusting the capacitances C1 and C2.

Specifically, an electric potential of the conductive plate 25 is denoted by V1, and an electric potential applied to the wiring layer 18 is denoted by V2. Note that, as described above, a ground electric potential is assumed to be applied to the conductive plate 24. In this case, V1 is expressed by the following mathematical expression in relation to V2.

$$V1 = \{C2/(C1+C2)\} \times V2 \qquad \text{Mathematical expression 1}$$

Note that, as described above, the conductive plate 25 is arranged between the conductive plate 24 and the wiring layer 18. With this structure, an electric potential at a middle level between electric potentials applied to the conductive plate 24 and to the wiring layer 18 is applied to the conductive plate 25.

As shown in FIG. 3, a solid line therein indicates a case where a separation distance L1 is 36 μm, and a dashed-dotted line therein indicates a case where the separation distance L1 is 45 μm in the structure shown in FIG. 2A.

As indicated by the solid line, in a case where the conductive plate 25 is arranged in order to satisfy the following mathematical expression, the withstand voltage of the LDMOSFET is 320 V or higher.

$$0.3 < C2/(C1+C2) < 0.6 \quad \text{Mathematical expression 2}$$

On the other hand, as indicated by the dashed-dotted line, in a case where the conductive plate 25 is arranged in order to satisfy the following mathematical expression, the withstand voltage of the LDMOSFET is 320 V or higher.

$$0 < C2/(C1+C2) < 0.6 \quad \text{Mathematical expression 3}$$

That is, in the structure shown in the FIG. 2A, although there might be some differences depending on the length of the separation distance L1, the conductive plate 25 is arranged between the conductive plate 24 and the wiring layer 18 in order that the electric potential V1 of the conductive plate 25 can be in a range from 0.3 to 0.6 times of the electric potential V2 of the wiring layer 18. With this structure, the conductive plate 25 has the shielding effect against the wiring layer 18. Thereby, influence given on the electric potential distribution of the epitaxial layer 3 by the wiring layer 18, to which a high electric potential is applied, is reduced. On the other hand, the conductive plate 25 has the field plate effect against the electric potential distribution of the epitaxial layer 3. Thereby, it comes to be possible to reduce concentration of equipotential lines to the one edge 28 of the conductive plate 24, and hence to reduce the electric field concentration to the one edge 28 of the conductive plate 24.

Specifically, as shown in the FIG. 4A, when the electric potential V1 of the conductive plate 25 is 0.6 times of the electric potential V2 of the wiring layer 18, regions to which equipotential lines concentrate are dispersed to the one edge 27 of the conductive plate 25 and to the one edge 28 of the conductive plate 24. Eventually, as indicated by a hatching area shown in FIG. 4B, impact ionization occurs in the epitaxial layer 3 under the one edge 28 of the conductive plate 24. However, by setting a desired electric potential on the conductive plate 25 with the pattern arrangement of the conductive plate 25, it comes to be possible to reduce the electric field concentration on the one edge 28 of the conductive plate 24, and thereby to increase the withstand voltage characteristic of the LDMOSFET.

Figure 5:
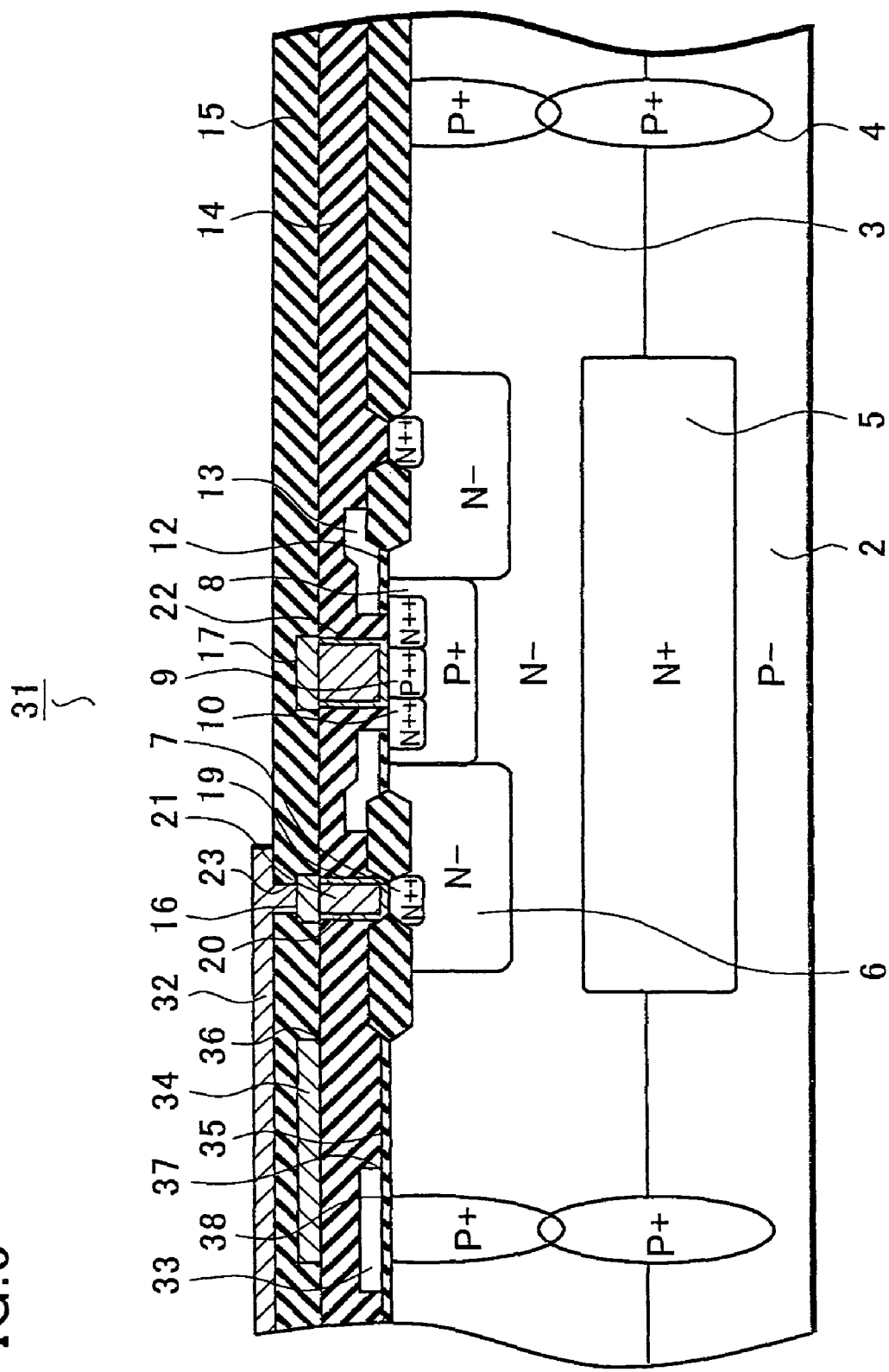
FIG. 5 is a cross-sectional view for explaining the N-channel LDMOSFET in the embodiment of the present invention.

Next, a semiconductor device in another embodiment of the present invention will be described in detail with reference to FIG. 5. FIG. 5 is a cross-sectional view for explaining an N-channel LDMOSFET in this embodiment.

Note that, as shown in FIG. 5, this embodiment of the present invention assumes a structure intended to reduce an electric field concentration by arranging two conductive plates over an isolation region, the two conductive plates both being in floating states. In this case, a structure of an N-channel LDMOSFET 31 which is formed in element formation regions has the same structure as the N-channel LDMOSFET 1 shown in FIG. 1. Therefore, the description of FIG. 1 should be referred for a description of the N-channel LDMOSFET 31, and the same reference numerals are attached to the components in FIG. 5 which are the same as the respective components shown in FIG. 1. Furthermore, for a description of a semiconductor device in the other embodiment of the present invention, FIGS. 2A to 3 should be referred as appropriate.

In this embodiment, in a region where a wiring layer 32 connected to a drain electrode 16 traverses over an isolation region 4, conductive plates 33 and 34 are formed. Note that the conductive plate 33 in this embodiment corresponds to "a first conductive plate" and the conductive plate 34 corresponds to "a second conductive plate" of the present invention, respectively.

The conductive plate 33 is formed above a silicon oxide film 35 on a top surface of the isolation region 4. The conductive plate 33 is formed in the same process as a formation process of a gate electrode 13, and is formed of the same material as the gate electrode 13. The silicon oxide film 35 is formed in the same process as a formation process of a formation process of a gate oxide film 12, and is formed to have the same film thickness as the gate oxide film 12. Moreover, the conductive plate 33 in the floating state is formed to be extended toward element formation regions in a manner covering over a PN junction region between the isolation region 4 and an epitaxial layer 3.

The conductive plate 34 is formed in a formation process of the firstly deposited metal layer for forming the drain electrode 16 and the like, and is formed of the same material as the drain electrode 16. The conductive plate 34 is formed between insulating films 14 and 15, and is in the floating state. Additionally, one edge 36 of the conductive plate 34 is more distant from the isolation region 4 than one edge 37 of the conductive plate 33.

As described above, in this embodiment also, the isolation region 4 and the conductive plate 33 are in capacitive coupling with each other, the conductive plate 33 and the conductive plate 34 are in capacitive coupling with each other, and, the conductive plate 34 and the wiring layer 32 are in capacitive coupling, respectively through the insulating films 14, 15 and the silicon oxide film 35. In this embodiment, the conductive plate 33 is formed for the purpose of reducing the electric field concentration in the vicinity of edge 38 of the isolation region 4 by a shielding effect thereof. Moreover, it is desirable that an electric potential of the conductive layer 33 be set higher than an electric potential of the isolation region 4 and not higher than 10 V level in dependence on a pattern arrangement of the conductive plate 33. Here, the silicon oxide film 35 at a bottom surface of the conductive plate 33 is formed with the same conditions as the gate oxide film 12. In this case, it is required to ensure reliability of the silicon oxide film 35, in order to prevent the silicon oxide film 35 from being destroyed by an electric field from the conductive plate 33, and the like. For that purpose, it is desirable that an upper limit of an electric potential of the conductive layer 33 be 10 V level. Note that, in order that a capacitance of the isolation region 4 and the conductive plate 33 can exceed a capacitance of the conductive plate 33 and the wiring layer 32, the conductive plate 33 is arranged across the top surface of the isolation region 4. With this structure, it is possible to set an electric potential of the conductive layer 33 higher than an electric potential of the isolation region 4 and not higher than 10 V level.

In this embodiment, an electric potential of the conductive layer 33 is set higher than an electric potential of the isolation region 4 and not higher than 10 V level by a capacitance division ratio thereof. Thereby, as described above, the conductive plates 33 results in having the field plate effect while having the shielding effect. With this structure, it comes to be possible to reduce the electric field concentration in the vicinity of the edge 38 of the isolation region 4, and hence to increase a withstand voltage characteristic of the LDMOSFET 31.

On the other hand, the conductive plate 34 is arranged in a desired region mainly for the purpose of obtaining the field plate effect. Here, a capacitance of the conductive plates 33 and 34 is denoted by C3, and a capacitance of the conductive plate 34 and the wiring layer 32 is denoted by C4. An electric potential of the conductive plate 33 is not higher than 10 V level. Therefore, as described by using FIG. 3, it comes to be possible to reduce the electric field concentration which occurs in the one edge 37 of the conductive plate 33 by having the conductive plate 34 arranged so that a valued found by C4/(C3+C4) can fall in a range approximately from 0.3 to 0.6. Thereby, the withstand voltage characteristic of the LDMOS-FET 31 comes to be increased.

Figure 6A:
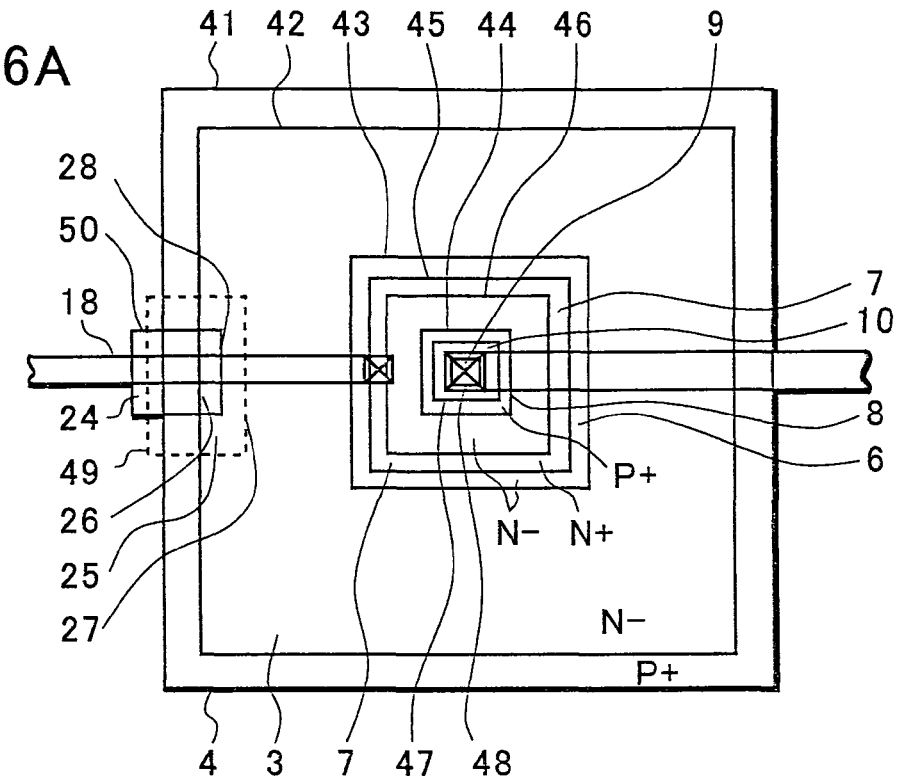
FIGS. 6A and 6B are plan views for explaining the N-channel LDMOSFETs in the respective embodiments of the present invention.
Figure 6B:
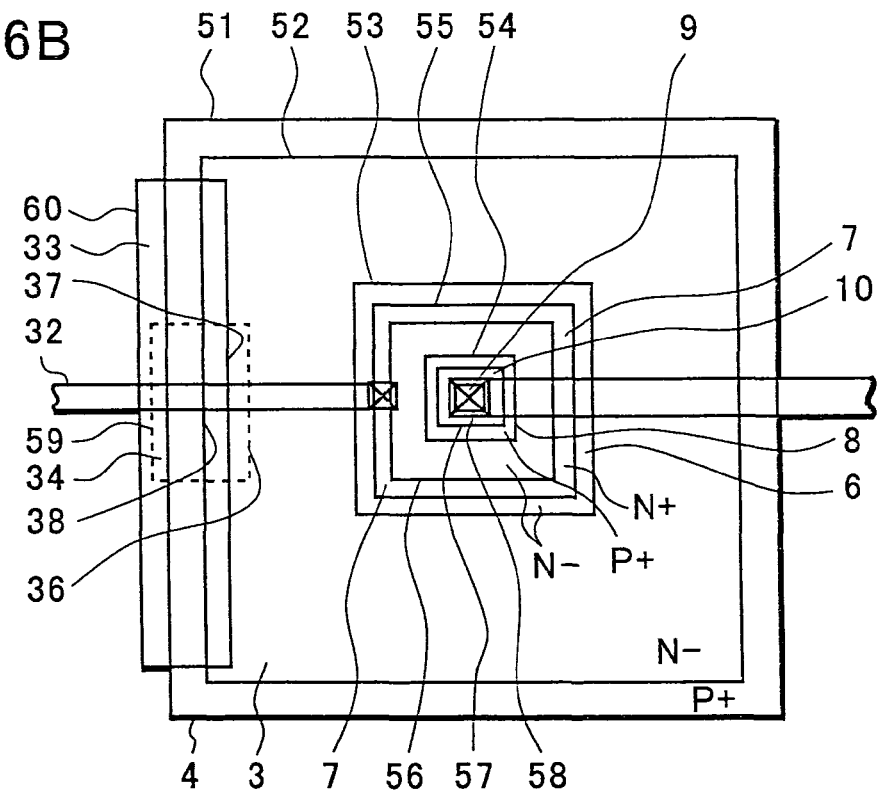

Next, planar patterns of the semiconductor devices shown in FIGS. 1 and 5 will be described by using FIGS. 6A and 6B. FIG. 6A is a plan view of the N-channel LDMOSFET shown in FIG. 1, and FIG. 6B is a plan view of the N-channel LDMOSFET shown in FIG. 5. Note that, when components of the LDMOSFET in FIG. 6 are described, the same reference numerals are attached to the components thereof which are the same as the respective components shown in FIGS. 1, 2 and 5.

As shown in FIG. 6A, in an inward direction from the outermost perimeter, the P-type isolation region 4 is indicated between a solid line 41 and a solid line 42, the N-type epitaxial layer 3 between the solid line 42 and a solid line 43, the N-type diffusion region 6 between the solid line 43 and a solid line 44, the N-type diffusion region 7 between a solid line 45 and a solid line 46, the P-type diffusion region 8 between the solid line 44 and a solid line 47, and the N-type diffusion region 10 between the solid line 47 and a solid line 48, and a P-type diffusion region 9 is indicated by a frame of the solid line 48. Note that the gate electrode 13 and a wiring layer connected to the gate electrode are omitted.

As described above, the wiring layer 18 is connected to the drain electrode 16 (refer to FIG. 1) above the N-type diffusion region 7, and a power source voltage (Vcc) is applied to the drain electrode 16 through the wring layer 18. There, the wiring layer 18 traverses over the isolation region 4 to be drawn to the other one of the element formation region. In a region where the wiring layer 18 traverses over the isolation region 4, the conductive plates 24 and 25 are formed under the wiring layer 18.

The conductive plate 24 is electrically connected to the isolation region 4 and arranged in a manner covering over the PN junction region between the isolation region 4 and the epitaxial layer 3. There, by a shielding effect of the conductive plate 24, an electric field concentration in the vicinity of edge 26 (refer to FIG. 2A) of the isolation region 4 is reduced, whereby a withstand voltage between the drain and source is increased. For that purpose, the conductive plate 24 is arranged in a manner straddling the isolation region 4, in order to be arranged in both of the two adjacent element formation regions with the isolation region 4 interposed therebetween.

The conductive plate 25 is formed between the insulating films 14 and 15 (refer to FIG. 1), in the floating state. The conductive plate 25 results in having an electric potential at a middle level between electric potentials of the wiring layer 18 and the conductive plate 24, by a capacitance division ratio thereof to the wiring layer 18 and the conductive plate 24. There, the conductive plate 25 has a field plate effect, whereby the electric field concentration in the vicinity of one edge 28 of the conductive plate 24 is reduced and hence the withstand voltage between the drain and source is increased. For that purpose, one edge 27 of the conductive plate 25 is more distant from the isolation region 4 than the one edge 28 of the conductive plate 24 is. On the other hand, the conductive plate 25 is designed in order that an electric potential of the conductive plate 24 can be the desired one. There, both cases are applicable in which the other edge 49 of the conductive plate 25 is more distant or not from the isolation region 4 than the other edge 50 of the conductive plate 24 is.

As shown in FIG. 6B, in an inward direction from the outermost perimeter, the P-type isolation region 4 is indicated between a solid line 51 and a solid line 52, the N-type epitaxial layer 3 between the solid line 52 and a solid line 53, the N-type diffusion region 6 between the solid line 53 and a solid line 54, the N-type diffusion region 7 between solid lines 55 and 56, the P-type diffusion region 8 between the solid line 54 and a solid line 57, and the N-type diffusion region 10 between the solid line 57 and a solid line 58, and the P-type diffusion region 9 is indicated by a frame of the solid line 58. Note that the gate electrode 13 and a wiring layer connected to the gate electrode are omitted.

As described above, the wiring layer 32 is connected to the drain electrode 16 (refer to FIG. 5) above the N-type diffusion region 7, and a power source voltage (Vcc) is applied to the drain electrode 16 through the wring layer 32. There, the wiring layer 32 traverses over the isolation region 4 to be drawn to the other one of the element formation regions. The conductive plates 33 and 34 are formed under a region where the wiring layer 32 traverses over the isolation region 4.

The conductive plate 33 is formed in the floating state, on the silicon oxide film 35 (refer to FIG. 5) on the top surface of the isolation region 4. The conductive plate 33 is in capacitive coupling with the isolation region 4 through the silicon oxide film 35, whereby the conductive plate 33 results in having a predetermined electric potential. For example, the conductive plate 33 is arranged in a manner covering over the PN junction region between the isolation region 4 and the epitaxial layer 3, and also in a manner covering one side line of the isolation region 4. There, although an electric potential of the conductive plate 33 is changed in dependence on a capacitance of the conductive plate 33 and the isolation region 4, with the use of a pattern of the isolation region 4, the electric potential of the conductive layer 33 can be adjusted by arranging the conductive pattern 33 on the top surface of the isolation region 4. For example, in order that a capacitance of the isolation region 4 and the conductive plate 33 can exceed a capacitance of the conductive plate 33 and the wiring layer 32, the conductive plate 33 is arranged across the top surface of the isolation region 4. With this structure, it is possible to set an electric potential of the conductive layer 33 higher than an electric potential of the isolation region 4 and not higher than 10 V level. Note that, in a region where the conductive plate 33 is arranged, an opening is provided in the LOCOS oxide film on the isolation region 4, and the silicon oxide film 35 is formed therein.

Moreover, by setting an electric potential of the conductive plate 33 not higher than 10 V level, the electric field concentration to the one edge 38 of the isolation region 4 is reduced by the shielding effect of the conductive plate 33, whereby the withstand voltage between a drain and a source is increased. For that purpose, the conductive plate 33 is arranged in a manner straddling the isolation region 4, in order to be arranged in both of the two adjacent element formation regions with the isolation region 4 interposed therebetween.

The conductive plate 34 is formed between the insulating films 14 and 15 (refer to FIG. 5), in the floating state. There, the isolation region 4 and the conductive plate 33 are in make capacitive coupling with each other, the conductive plate 33 and the conductive plate 34 are in capacitive coupling with each other, and, the conductive plate 34 and the wiring layer 32 are in capacitive coupling with each other. The conductive plate 34 results in having an electric potential at a middle level between electric potentials of the wiring layer 32 and the conductive layer 33, by a capacitance division ratio thereof. There, the conductive plate 34 has the field plate effect, whereby the electric field concentration in the vicinity of the one edge 37 of the conductive plate 33 is reduced, and hence the withstand voltage between the drain and source is increased. For that purpose, the one edge 36 of the conductive plate 34 is more distant from the isolation region 4 than the one edge 37 of the conductive plate 33 is. On the other hand, the conductive plate 34 is designed in order that electric potentials of the conductive plates 33 and 34 can be the desired one. There, either of cases is applicable in which the other edge 59 of the conductive plate 34 is more distant or not from the isolation region 4 than the other edge 60 of the conductive plate 33 is. Additionally, in accordance with set electric potentials of the conductive plates 33 and 34, it is possible to apply arbitrary design changes to the conductive plate 34.

Note that, although the descriptions have been given of the case where a drain electrode of an N-channel LDMOSFET or a wiring layer electrically connected to a drain electrode traverses over an isolation region in this embodiment, the present invention is not limited to this case. For example, in a P-channel LDMOSFET, the same effect can be obtained in a case where a source electrode or a wiring layer electrically connected to a source electrode traverses over an isolation region. Additionally, in an NPN bipolar transistor, the same effect can be obtained in a case where a collector electrode or a wiring layer electrically connected to a collector electrode traverses over an isolation region. Additionally, in a PNP bipolar transistor, the same effect can be obtained in a case where an emitter electrode or a wiring layer electrically connected to an emitter electrode traverses over an isolation region. Moreover, in a diode, the same effect can be obtained in a case where an anode electrode or a wiring layer electrically connected to an anode electrode traverses over an isolation region. Furthermore, in a case a light receiving portion of a light semiconductor device, where a diode is used with a reverse bias applied, the same effect can be obtained when a cathode electrode or a wiring layer electrically connected to a cathode electrode traverses over an isolation region. That is, in any case where a wiring layer having a higher electric potential than an isolation region traverses over the isolation region, and gives an influence on an electric potential distribution under the wiring layer, the same effect can be obtained by providing a structure having the above described conductive plates. Likewise, various modifications are possible within the scope not departing from the main point of the embodiment of the present invention.

In the embodiments of the present invention, in a region where a wring layer with a high electric potential applied thereto traverses over an isolation region, a conductive plate having electric potential equal to that of the isolation region, and another conductive plate being in a floating state are arranged. With this structure, it comes to be possible to reduce an electric field concentration in the vicinity of an edge of the isolation region located under the wiring layer, and hence to increase a withstand voltage characteristic of the semiconductor device.

Additionally, in the embodiment of the present invention, under the wring layer with a high electric potential applied thereto, the conductive plate in the floating state is arranged. The conductive plate has a desired electric potential by a capacitance division ratio thereof. With this structure and a manufacturing method thereof, the conductive plate has a shielding effect against the wiring layer. On the other hand, a field plate effect of the conductive plate makes it possible to increase the withstand voltage characteristic of a semiconductor element.

Moreover, in the embodiment of the present invention, under the wring layer with a high electric potential applied thereto, the conductive plate having the electric potential equal to that of the isolation region covers over a junction region between the isolation region and the semiconductor layer. With this structure, the shielding effect by the conductive plate is obtained, whereby it comes to be possible to reduce the electric field concentration in the vicinity of the edge of the isolation location.

Additionally, in the embodiment of the present invention, under the wring layer with a high electric potential applied thereto, two conductive plates in floating states are arranged. Out of these conductive plates, a conductive plate closer to a top surface of an isolation region results in having an electric potential higher than the electric potential of the isolation region. With this structure, the conductive plate closer to the top surface of the isolation region mainly performs a function as the shielding effect. On the other hand, the same conductive plate also takes a role for the field plate effect, whereby it is possible to increase the withstand voltage characteristic of a semiconductor element.

What is claimed is:

1. A semiconductor device comprising:
an isolation region which divides a semiconductor layer into a plurality of element formation regions;
an insulating layer formed on a top surface of the semiconductor layer; and
a wiring layer traversing over the isolation region, and wired from one to other one of the element formation regions on a top surface of the insulating layer
and further comprising in the insulating layer under the wiring layer:
a first conductive plate arranged in a manner covering over a junction region between the isolation region and the semiconductor layer, and electrically connected to the isolation region; and
a second conductive plate arranged, in a floating state, between the first conductive plate and the wiring layer, wherein at least a part of a region of the second conductive plate is opposite each of the first conductive plate and the wiring layer.

2. The semiconductor device according to claim 1, wherein the second conductive plate is extended under the wiring layer in a direction separating away from the isolation region, and one edge of the second conductive plate is more distant from the isolation region than one edge of the first conductive plate is.

3. The semiconductor device according to any one of claims 1 and 2, wherein the second conductive plate has an electric potential which is 0.3 to 0.6 times of an electric potential applied to the wiring layer.

4. The semiconductor device according to any one of claims 1 and 2, wherein the first conductive plate is formed of a polysilicon film.

5. The semiconductor device according to any one of claims 1 and 2, wherein the first conductive plate and the second conductive plate are formed under the wiring layer to which an electric potential higher than that of the isolation region is applied.

6. The semiconductor device according to claim 1, wherein the first conductive plate and the second conductive plate are separated by the insulating layer.

* * * * *